United States Patent
Fukuda et al.

(10) Patent No.: US 6,329,646 B1
(45) Date of Patent: Dec. 11, 2001

(54) HIGH FREQUENCY HEATING APPARATUS WITH FAN SENDING AIR BELOW APPARATUS TO PREDETERMINED DIRECTION

(75) Inventors: Yoshihito Fukuda, Shiga; Junji Murata, Kusatsu, both of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/692,308

(22) Filed: Oct. 20, 2000

(30) Foreign Application Priority Data

Oct. 27, 1999 (JP) ................................. 11-305799
Oct. 27, 1999 (JP) ................................. 11-305800

(51) Int. Cl.[7] .................. H05B 6/68; H05B 6/80
(52) U.S. Cl. .................. 219/757; 219/702; 219/719; 126/299 D; 126/21 A
(58) Field of Search .................. 219/757, 702, 219/719, 720; 126/299 R, 299 D, 273 A, 275 E, 21 A

(56) References Cited

U.S. PATENT DOCUMENTS

| | | | |
|---|---|---|---|
| 4,056,699 | * 11/1977 | Jordan | 219/702 |
| 4,143,646 | * 3/1979 | Sampsel | 126/299 D |
| 4,418,261 | * 11/1983 | Jailor et al. | 219/757 |
| 4,575,601 | * 3/1986 | Taguchi et al. | 219/702 |
| 4,785,152 | * 11/1988 | Hirata et al. | 219/719 |
| 4,886,046 | * 12/1989 | Welch | 219/757 |
| 5,498,858 | * 3/1996 | Jeong | 219/757 |
| 5,986,245 | * 11/1999 | Kang | 219/702 |
| 6,093,922 | * 7/2000 | Kim | 219/757 |

FOREIGN PATENT DOCUMENTS 10-110984 * 4/1998 (JP) .

* cited by examiner

Primary Examiner—Philip H. Leung
(74) Attorney, Agent, or Firm—Armstrong, Westerman, Hattori, McLeland & Naughton, LLP

(57) ABSTRACT

A microwave oven is installed above a cooking counter such as a kitchen stove counter. The microwave oven has its housing covered by an oven case, and incorporates a fan. By driving the fan, the microwave oven can have the hot air generated at the cooking counter inhaled from beneath the oven case and discharged from a front opening. The front opening is formed at the front face of the oven case. An operation display device is provided at the front face of the oven case. By one operation of a predetermined key on the operation display device, the drive of the fan is initiated and then automatically terminated at an elapse of a predetermined time (for example, 10 minutes).

7 Claims, 10 Drawing Sheets

HIGH FREQUENCY HEATING APPARATUS WITH FAN SENDING AIR BELOW APPARATUS TO PREDETERMINED DIRECTION

BACKGROUND OF THE INVENTION

1. Field of the Invention

The present invention relates to high frequency heating apparatuses, particularly to high frequency heating apparatuses of various types such as a microwave oven.

2. Description of the Background Art

In conventional cases, a microwave oven may be installed above a cooking counter such as a kitchen stove counter from the standpoint of effectively utilizing the space above the cooking counter.

When cooking is carried out at the cooking counter, the heat therefrom rises to adversely affect the microwave oven. An approach could be taken to install a ventilation fan at the microwave oven per se to drive the fan to discharge the heat.

In a conventional microwave oven, the start and end of a ventilation operation was effected through the key operation of the user.

In the conventional case, the user had to operate the end specification key in order to terminate the ventilation operation. This may be a bother to the user. In the case the user forgets to operate the end key, the ventilation operation will be continued to result in wasting power consumption.

In order to eliminate the key operation by the user to terminate the ventilation operation, the applicant of the present invention considered that the conventional problem can be solved by utilizing a timer, for example, to automatically terminate the ventilation operation at an elapse of a predetermined time from the start of the ventilation operation. In this case, the key operation is bothersome since the key operation to initiate a ventilation operation and the key operation to specify the operation period of time of the ventilation operation had to be carried out. If the period of time of the ventilation operation is to be set based on the unit of one minute per one operation, for example, the number of key operations required will increase as a longer operation period of time is to be set such as 10 minutes, 20 minutes, and the like. The operation load on the user is rather heavy in such a conventional high frequency heating apparatuses. There was a problem that the usability thereof is poor and bothersome.

SUMMARY OF THE INVENTION

In view of the foregoing, an object of the present invention is to alleviate the operation load on the user of a high frequency heating apparatus capable of ventilation operation when the ventilation operation is to be restricted in time.

Another object of the present invention is to allow setting the period of the ventilation operation to a relatively long time with the minimum manipulation.

A high frequency heating apparatus of the present invention is installed above a cooking appliance to cook an object. The high frequency heating apparatus includes a case covering the housing thereof, a fan to send the air below the case in a predetermined direction towards outside the case, an operation unit operated to set an operation of the fan, and a control unit controlling the operation of the fan. The control unit executes time limit control in response to one operation of the operation unit. The time limit control is provided to operate the fan for a predetermined period of time after initiating the fan drive and then terminating the fan drive.

According to the present invention, one operation by the user with respect to the operation unit allows the fan drive to be automatically stopped after the fan has been driven for a predetermined period of time.

Accordingly, the users operation can be simplified when the ventilation operation is to be restricted in time in a high frequency heating apparatus.

In the high frequency heating apparatus of the present invention, the control unit preferably extends the time to drive the fan for every predetermined time in the time limit control according to the number of times the operation unit has been operated.

Accordingly, the user can set a long period time of the ventilation operation in the time limit control with a relatively small number of operations.

Furthermore, the high frequency heating apparatus of the present invention preferably extends the time of driving the fan in the time limit control under the condition that the operation on the operation unit has been effected before the elapse of a particular time from the immediately preceding operation on the operation unit.

Accordingly, the period of time of driving the fan can be extended by a unitary operation unit being operated by a particular manipulation manner.

Therefore, the ventilation operation will not be extended in the time limit control by just operating the operation unit a plurality of times. Also, the user can set a long ventilation operation in the time limit control by a relatively small number of operations.

The high frequency heating apparatus of the present invention further includes a start designation unit operated to initiate the fan drive, and an end designation unit operated to terminate the fan drive. The control unit preferably drives the fan according to the operation of the start designation unit and the end designation unit.

Accordingly, the user can end the fan drive automatically according to the time limit control, or manually according to the operation on the end designation unit.

Since a ventilation operation restricted in time can be executed through the fan by just one manual operation by the user, the user does not have to execute an operation to end the ventilation operation.

In the case where the ventilation operation is to be terminated manually, the user initiates the fan drive with the start designation unit and terminates the fan drive with the end designation unit.

By increasing the number of times of operation on the operation unit by the user, the operation time of the fan can be extended by every constant period of time. If the constant period of time is defined as 10 minutes, for example, the user can set a long period of time of the fan operation with a relatively small number of operations.

In the high frequency heating apparatus of the present invention, the operation unit is preferably formed of a touch panel. The touch panel includes a transparent substrate and a film. The transparent substrate includes a touch key arranged at a site facing the operator. The film is arranged at the side opposite of the plane of the substrate facing the operator, and has a reflectance of visible light higher than that of the substrate.

Accordingly, the member behind the substrate of a touch panel can be concealed from the operator while providing the sense of high quality to the touch panel. The sense of high quality can be provided to the touch panel by forming the substrate of a transparent member such as glass. By disposing a film having a reflectance of visible light higher than that of the substrate at one plane of the substrate, the member located behind the substrate of the touch panel can be concealed from the operator.

In the high frequency heating apparatus of the present invention, the film is preferably a half mirror.

In the high frequency heating apparatus of the present invention, the substrate further includes a display unit displaying information at the back side of the plane facing the operator. The film preferably includes a first film arranged at a region corresponding to the display unit, and a second film arranged at a region other than the region corresponding to the display unit. The first film is formed of a half mirror. The second film is formed of a material that blocks visible light.

The high frequency heating apparatus of the present invention has a first electrode arranged at the plane facing the operator and a second electrode formed at the back side of the plane facing the operator. The film on the substrate is preferably arranged between the substrate and the second electrode. The second electrode is arranged corresponding to the first electrode at the back side of the plane facing the operator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
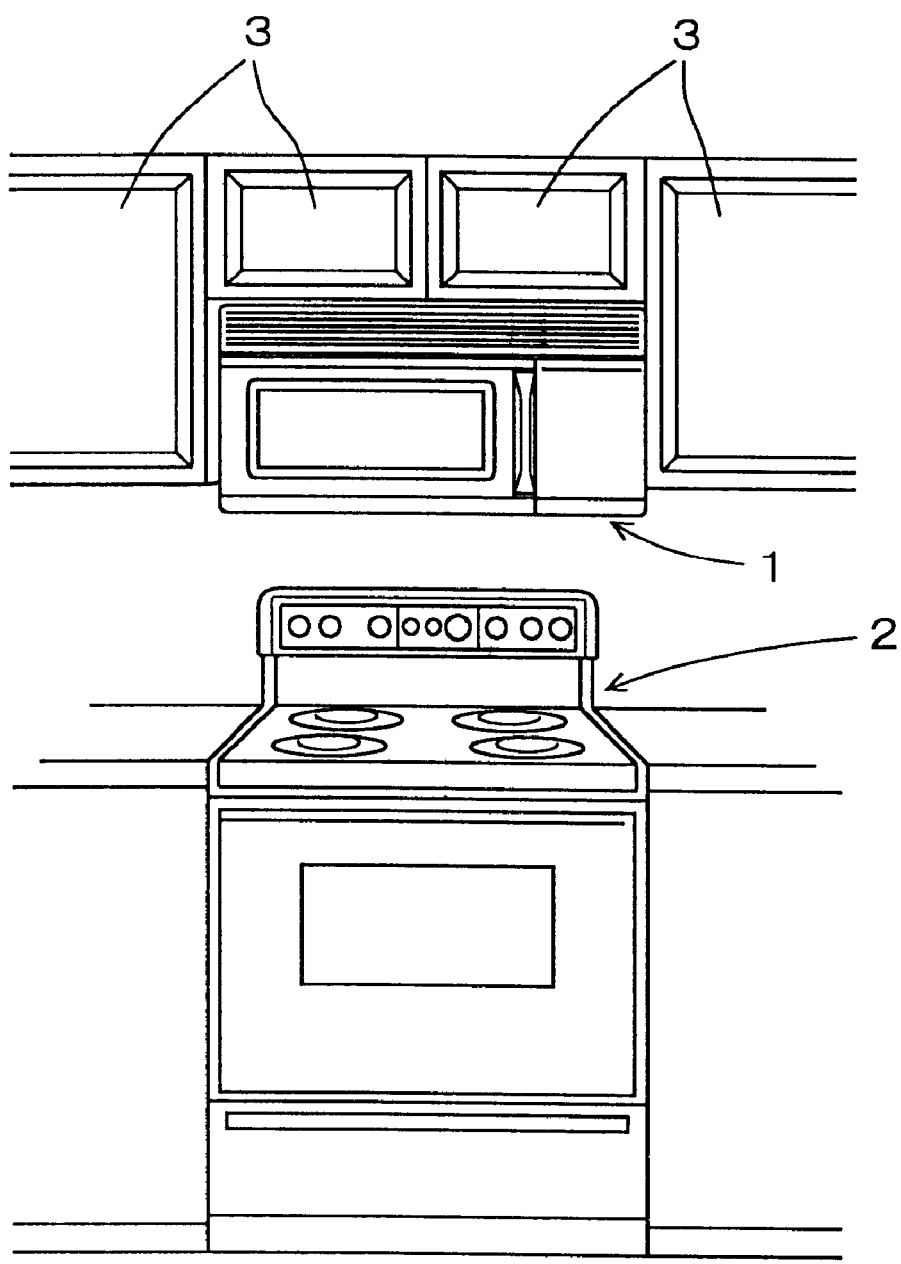
FIG. 1 shows the installation manner of a microwave oven according to an embodiment of the present invention.
Figure 2:
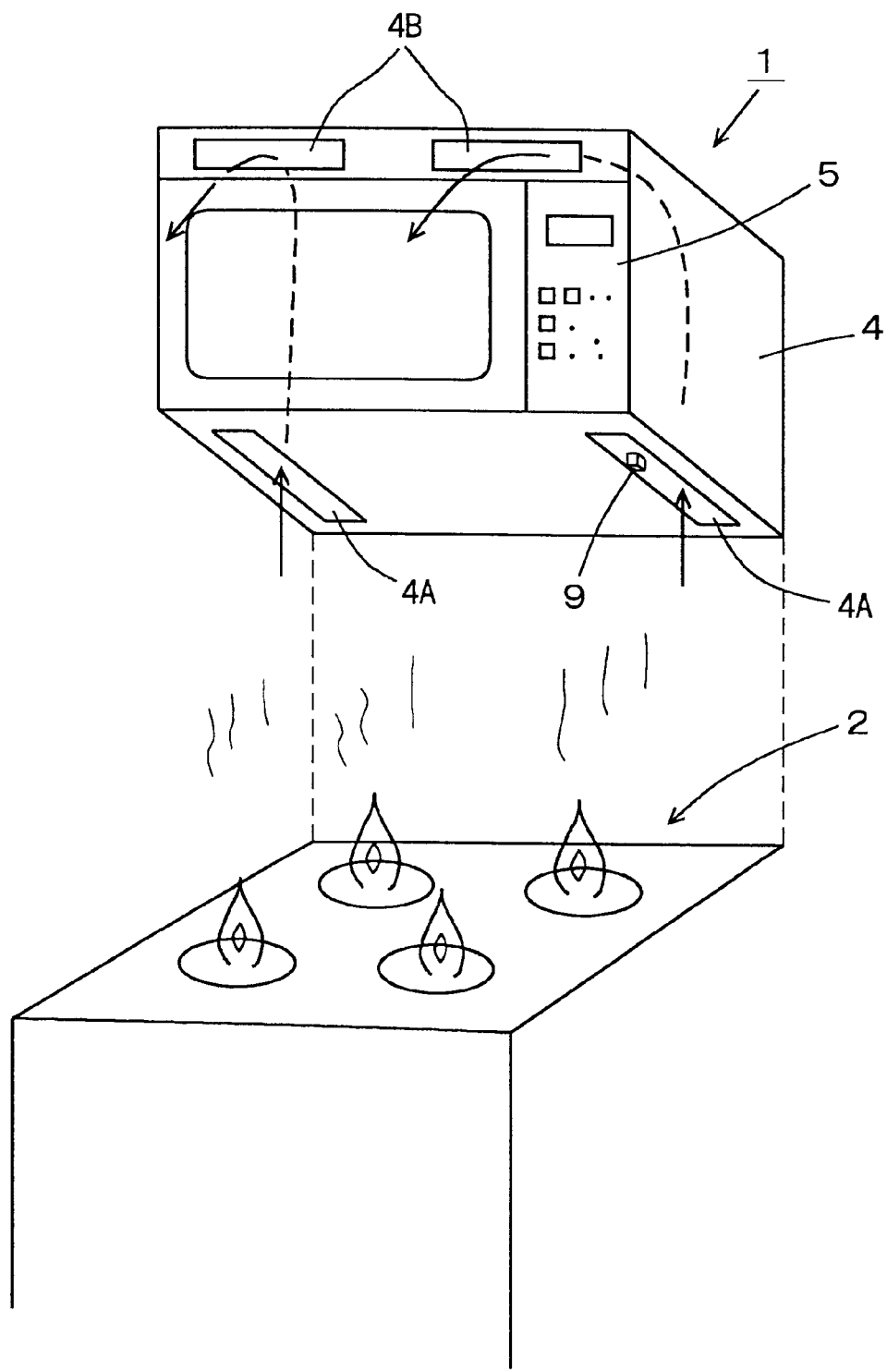
FIG. 2 shows a structure related to the ventilation function of the microwave oven of FIG. 1.
Figure 3:
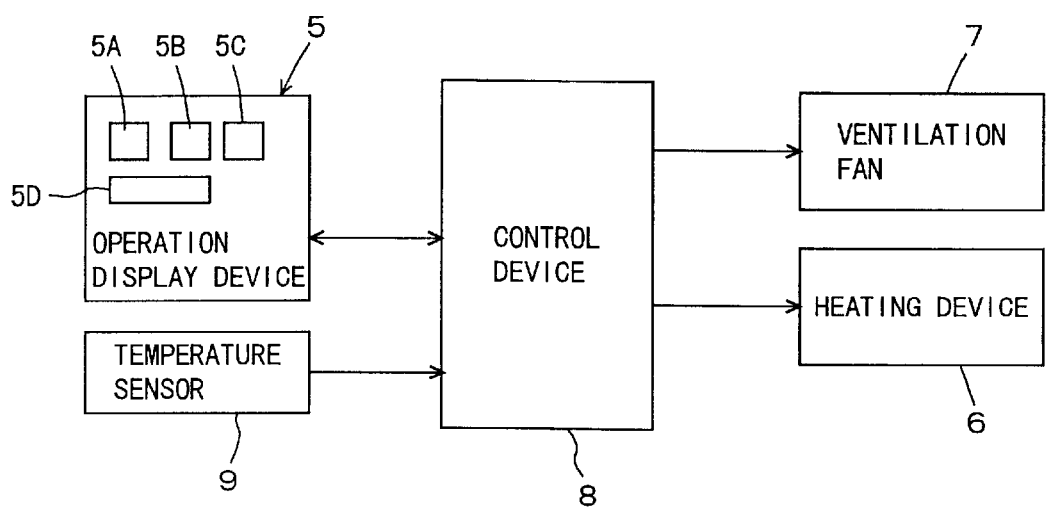
FIG. 3 is a schematic block diagram of the microwave oven of FIG. 1.

Embodiments of the present invention will be described with reference to the drawings.

A microwave oven 1 according to a first embodiment of the present invention is shown in FIG. 1 to FIGS. 6A–6C. Here, a microwave oven is taken as example of a high frequency cooking appliance.

Microwave oven 1 is the type installed in alignment with a hanging cupboard 3 above the space of a cooking counter 2 such as a kitchen stove counter. Microwave oven 1 is configured to discharge the hot air below microwave oven 1 to prevent the heat rising during the cooking operation at cooking counter 2 from thermally affecting microwave oven 1.

Microwave oven 1 of the present invention includes at least an operation display device 5, a heating device 6, a ventilation fan 7, and a control device 8.

Operation display device 5 is provided at the front face of oven case 4 to provide a signal corresponding to an operation by the user to control device 8 as well as displaying information such as the current time, the cooking type or the like. Operation display device 5 includes a cook start key 5A to carry out a cooking operation by heating device 6, and at least a ventilation key 5B to carry out continuously a ventilation operation, and a delay off key 5C to carry out a time limited ventilation operation.

Ventilation key 5B and delay off key 5C are switches of the rotary type. Ventilation key 5B is switched to the ventilation ability of HI (high power) at the first operation, to the ventilation ability of LOW (low power) at the second operation, and to stop the ventilation operation at the third operation. Delay off key 5C is switched to set the operation time to 10 minutes, 20 minutes, and 30 minutes at the first, second, and third operation, respectively. The aforementioned setting is repeated at one round of these number of operations.

Heating device 6 functions to heat and cook the material accommodated in the heating chamber by driving a heating source such as a heater, magnetron, or the like using commercially available power supplies.

Ventilation fan 7 is arranged at a predetermined site in oven case 4. A bottom opening 4A is provided at the bottom of oven case 4. A front opening 4B is provided at the upper region at the front of oven case 4. Ventilation fan 7 functions to inhale the hot air below oven case 4 via bottom opening 4A into oven case 4, and discharge the heat frontwards of oven case 4 via front opening 4B.

Control device 8 is formed of a microcomputer to control at least the display operation by operation display device 5, the cooking operation by cooking device 6, and the ventilation operation by ventilation fan 7.

The ventilation operation includes a continuous ventilation operation, time limited ventilation operation, and automatic ventilation operation. The continuous ventilation operation is an operation initiated and terminated by the manual operation through ventilation key 5B of operation display device 5. The time limited ventilation operation is the operation to start the drive of ventilation fan 7 by a manual operation through delay off key 5B on operation display device 5 and automatically terminate the operation at an elapse of a predetermined time. The automatic ventilation operation is the operation to automatically initiate ventilation when temperature increase at the area below oven case 4 is sensed by a temperature sensor 9 provided in bottom opening 4A of oven case 4 and automatically terminating the ventilation operation when removal of the hot air is sensed.

The present embodiment is characterized in that the start operation of a time limited ventilation operation and the specification operation of an operating period of time are simplified.

More specifically, as to the time limited ventilation operation, the ventilation operation can be executed for 10 minutes, 20 minutes, and 30 minutes by depressing once, twice, and three times, respectively, delay off key 5C. In other words, execution is allowed in units of ten minutes per one operation.

Figure 5:
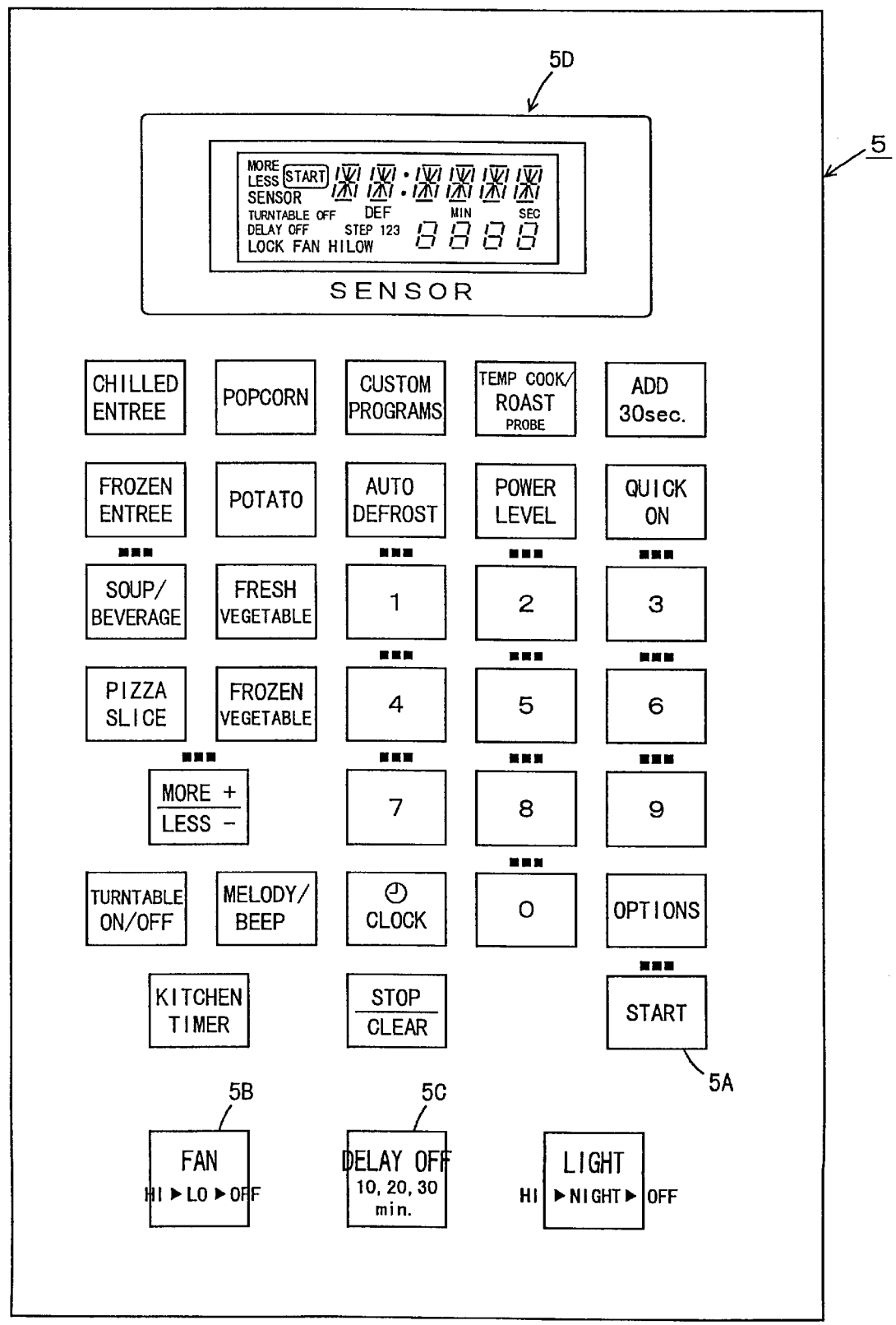
FIG. 5 is a front view of the operation display device of the microwave oven of FIG. 1.
Figure 6A:
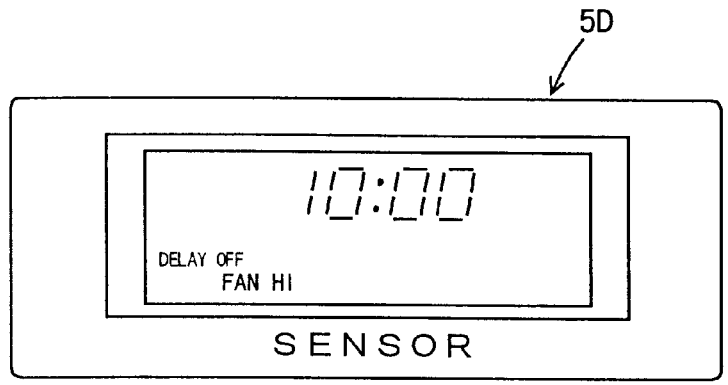
FIGS. 6A–6C show the time display manner of the time limited ventilation operation for the operation display device.
Figure 6B:
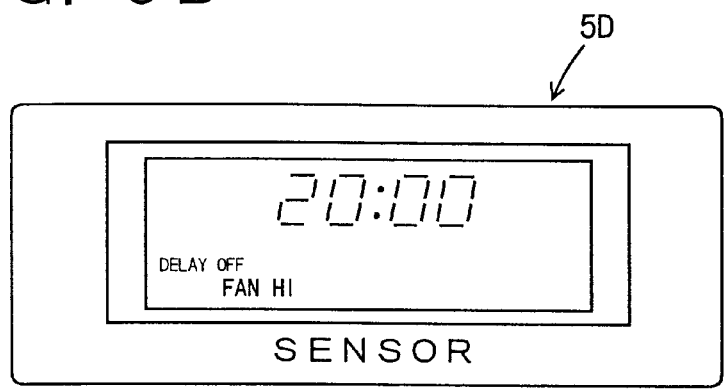
Figure 6C:
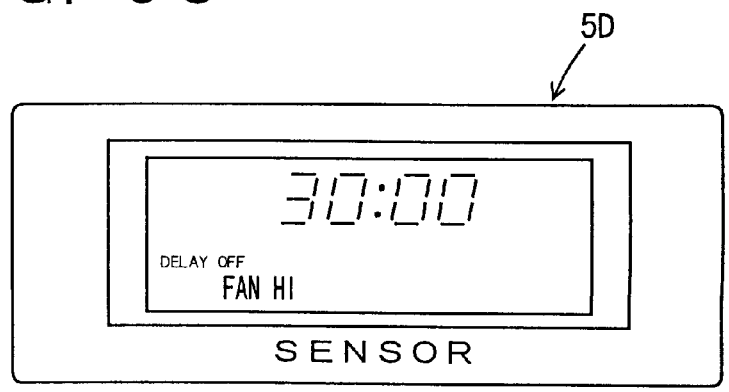

As shown in FIG. 5, operation display device 5 includes a display unit 5D that can at least display information related to the cooking operation, information of the current time, and information related to the ventilation operation. Information displayed at display unit 5D is provided to represent the text information such as "FAN", "HI", "LOW" and "DELAYOFF". For example, control device 8 functions to light up the text information of "FAN" when executing a continuous ventilation operation, the text information of "DELAYOFF" and "FAN" when executing a time limited ventilation operation, and the text information of "FAN" when executing an automatic ventilation operation, on display unit 5D to allow identification of each ventilation operation. Also, the illumination of the text information of "HI" or "LOW" representing the ventilation ability is turned on only when a continuous ventilation operation and time limited ventilation operation are executed. When a time limited ventilation operation is to be executed, numeric information indicating the specified operation time is lighted up, as shown in FIGS. 6A–6C. It is to be noted that the text information corresponding to the aforementioned ventilation ability is not displayed when an automatic ventilation operation is executed.

Figure 4:
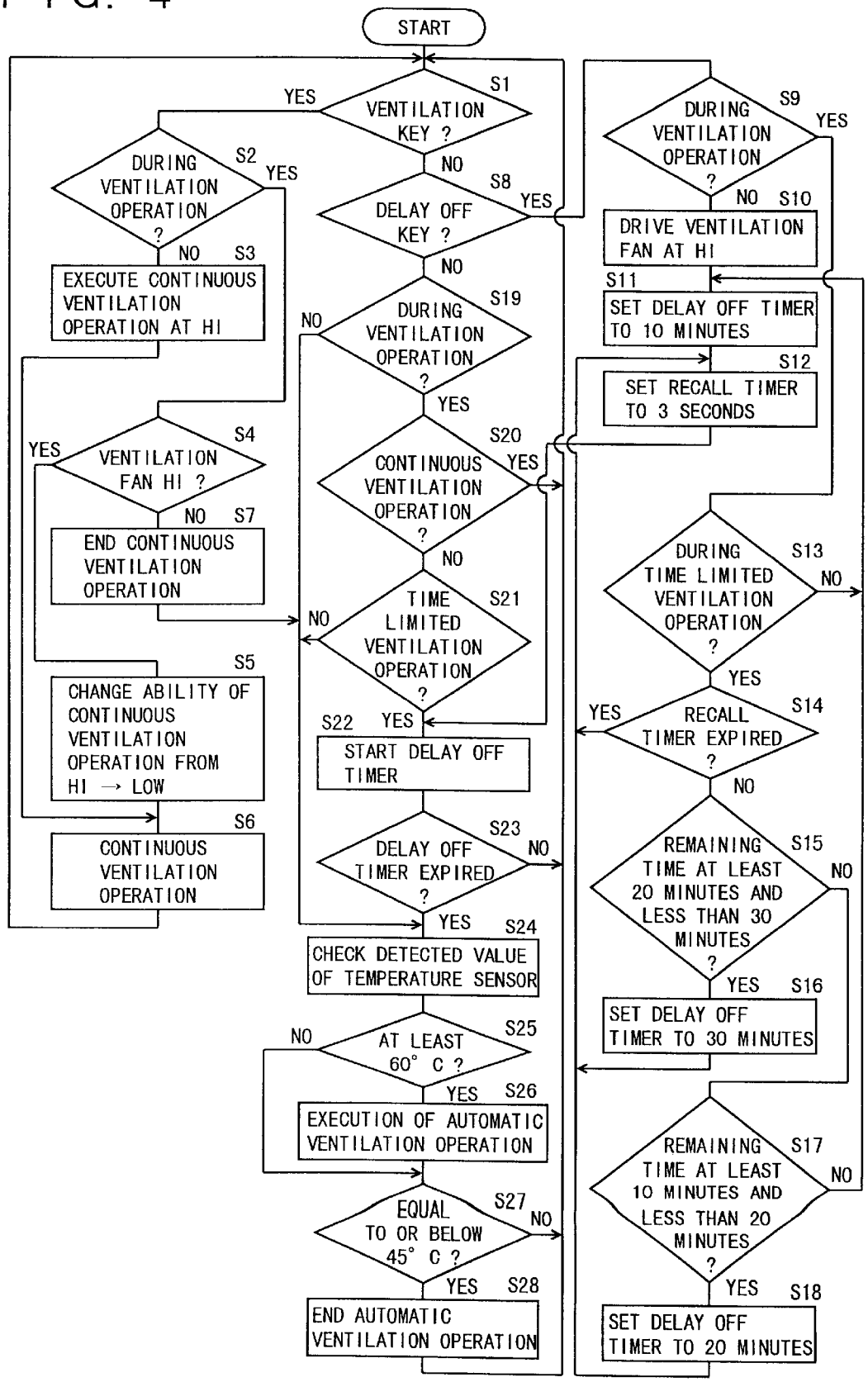
FIG. 4 is a flow chart of the operation of the microwave oven of FIG. 1.

The process of control device 8 as to the ventilation operation which is a feature of microwave oven 1 will be described with reference to the flow chart of FIG. 4.

Upon power on, operation of ventilation key 5B on operation display device 5 is checked at step S1. If ventilation key 5B has been operated, control proceeds to steps S2–S7 related to the continuous exhaust operation. If ventilation key 5B has not been operated, control proceeds to steps S8–S28 related to the time limited ventilation operation and automatic ventilation operation.

Upon confirmation of the operation of ventilation key 5B at step S1, control device 8 checks whether a ventilation operation is currently carried out or not at step S2. This corresponds to detecting whether the operation of ventilation key 5B is to start a ventilation operation or to alter the ventilation ability.

When recognition is made that a ventilation operation is not carried out at step S2, control proceeds to step S3 to execute the continuous ventilation operation at the ability of HI, and report thereof is made. More specifically, at step S3, ventilation fan 7 is driven at the ability of HI, and the illumination of the text information of "FAN" and the ventilation ability of "HI" are turned on at display unit 5C to notify execution of a manual ventilation operation at the ability of HI. If recognition is made that a ventilation operation is currently carried out at step S2, control proceeds to step S4 to determine whether ventilation fan 7 is already driven at the ability of HI.

When recognition is made that ventilation fan 7 is already driven at the ability of HI at step S4, control proceeds to step S5 to execute the continuous ventilation operation at the ability of LOW, and report thereof is made. More specifically, at step S5, ventilation fan 7 is switched to be driven at the ability of LOW, and illumination of the text information of "HI" is turned off and the illumination of text information "LOW" is turned on. At step S6, execution of a continuous ventilation operation is confirmed by control device 8, and control returns to step S1. If recognition is made that ventilation fan 7 is already driven at the ability of LOW at step S4, control proceeds to step S7 to terminate the continuous ventilation operation, i.e., stop the drive of ventilation fan 7. Then, control proceeds to the process of steps S24–S28 that will be described afterwards.

If recognition is made that ventilation key 5B is not operated at step S1, control proceeds to step S8 to check whether delay off key 5C is operated or not. When recognition is made of operation of delay off key 5C, control proceeds to the process of steps S9–S18 mainly related to a time limited ventilation operation. If recognition is made that delay off key 5C is not operated at step S8, control proceeds to steps S19–S28 related mainly to an automatic ventilation operation.

First, the process of steps S9–S18 will be described.

At step S9, determination is made whether a ventilation operation is currently carried out or not. More specifically, determination is made whether the operation is to be altered to the time limited ventilation operation during execution of a continuous ventilation operation or an automatic ventilation operation by the operation of delay off key 5C recognized at step S8.

When recognition is made that a ventilation operation is not currently carried out at step S9, a time limited ventilation operation of 10 minutes is executed at steps S10–S12. More specifically, at step S10, ventilation fan 7 is driven at the ability of HI. At step S11, the delay off timer counting the period of time of the time limited ventilation operation is set to 10 minutes at step S11. The illumination of the text information of "DELAYOFF", "FAN", "HI" and the numerical information of "10:00" are turned on to notify execution of a time limited ventilation operation for 10 minutes on display unit 5D. The recall timer is set so as to display the operation period of time for only three seconds (step S12). Then, control proceeds to the process of steps S22–S28.

When recognition is made that a ventilation operation is currently carried out at step S9, control proceeds to step S13 to determine whether the current ventilation operation is a time limited ventilation operation or not. This corresponds to determining whether the operation of delay off key 5C recognized at step S8 is to alter the operation period of time of the currently executed time limited ventilation operation. If determination is made that a time limited ventilation operation is not carried out currently, control proceeds to step S11 to execute a time limited ventilation operation of 10 minutes. If determination is made that a time limited ventilation operation is currently being carried out, control proceeds to step S14 to determine whether the recall timer set at step S12 has expired or not.

If determination has been made of expiration of the recall timer at step S14, control proceeds to step S12 to set the recall timer to 3 seconds. If the recall timer has not expired, control proceeds to step S15 to determine whether the remaining time of the delay off timer is at least 20 minutes and not more than 30 minutes.

When determination is made that the remaining time is within the aforementioned specified time at step S15, control proceeds to step S16 to set the delay off timer to 30 minutes to execute a time limited ventilation operate for thirty minutes. Then, control proceeds to step S12. If determination is made that the remaining time is not within the specified range at step S15, control proceeds to step S17 to determine whether the remaining time of the time limited ventilation operation is at least 10 minutes and not more than 20 minutes.

When determination is made that the remaining time is within the above-defined range at step S17, control proceeds to step S18 to set the delay off timer to 20 minutes to execute a time limited ventilation operation for twenty minutes. Then, control proceeds to step S12. When determination is made that the remaining time is outside the above-defined range at step S17, control proceeds to step S1 to set the delay off timer to ten minutes.

In other words, when delay off key 5C is operated during a time limited ventilation operation, the remaining time of operation is displayed. If delay off key 5C is further operated during the display of the remaining operation time, the operation time of the time limited ventilation operation is increased.

The process of steps S19–S28 will be described here.

At step S19, determination is made whether a ventilation operation is currently carried out or not. When determination is made that a ventilation operation is currently carried out at step S19, control proceeds to the process of steps S20–S23, otherwise to the process of steps S24–S28.

At step S20, determination is made whether the ventilation operation carried out currently is a continuous ventilation operation or not. When recognition is made of a continuous ventilation operation, control returns to step S1, otherwise to step S21 to determination whether the ventilation operation currently carried out is a time limited ventilation operation or not. When determination is made that a time limited ventilation operation is not carried out at step S21, control proceeds to step S24. If recognition is made of a time limited ventilation operation at step S21, control proceeds to step S22 to start the delay off timer. At step S23, determination is made whether the delay off timer has expired or not. If the delay off timer has expired, control returns to step S21, otherwise to the process of steps S24–S28.

Steps S24–S28 are executed, as necessary, depending upon whether an automatic ventilation operation is required or not.

More specifically, at step S24, the detected value of temperature sensor 9 is checked. Determination is made whether the value of temperature sensor 9 is 60° C. or above at step S25. When determination is made that the detected value is at least 60° C., control proceeds to step S26 to execute an automatic ventilation operation, and notification thereof is made. More specifically, at step S26, ventilation fan 7 is driven at the ability of HI, and the text information of "FAN" at display unit 5D is lighted up in a blinking manner to notify execution of an automatic ventilation operation. At this current stage, the illumination of the text information of "HI" representing the ventilation ability is not turned on. When determination is made that the detected temperature is under 60° C. at step S25, control proceeds to step S27 to determine whether the temperature is 45° C. or below.

When determination is made that the temperature is not above 45° C. at step S27, control proceeds to step S28 to terminate the automatic ventilation operation, i.e., stop the drive of ventilation fan 7. The blinking illumination of the text information of "FAN" on display unit 5D is turned off. Then, control returns to step S1. If determination is made that the temperature has exceeded 45° C. at step S27, control returns to step S1 to continue the automatic ventilation operation.

For the purpose of preventing the hot air generated at cooking counter 2 from thermally affecting microwave oven 1 installed at a site above cooking counter 2, the present invention is premised on the discharge of the heated air below microwave oven 1 manually or automatically, wherein a continuous ventilation operation carried out continuously without being restricted in time and a time limited ventilation operation that is restricted in time can be selected. Particularly in a time limited ventilation operation, both the start and the operating period of time can be set at the same time with a single operation of just delay off key 5C. Therefore, the load on the user's operation to execute a time limited ventilation operation is alleviated than the conventional case where the operation is executed by operating various keys.

Since the operating period of time can be increased in units of ten minutes by a plural operation of delay off key 5C, the load on the user's operation can be alleviated than the case where the operating period of time is set in units of 1 minutes.

In the present embodiment, the ventilation operation can be carried out restricted in time by just one manual operation by the user. The user does not have to operate the key to terminate the operation. Therefore, the usability is improved by alleviating the operation load on the user and initiating the operation promptly.

In the present embodiment, the operating period of time of the ventilation operation can be set at a stretch of 10 minutes, 20 minutes, or the like, for example by increasing the number of operations of the time specification operation by the user. Therefore, the number of operations can be reduced even in the case where a relatively long period of operation is to be specified. This is advantageous in alleviating the operation load of the user.

Second Embodiment

A second embodiment of the present invention will be described with reference to FIGS. 7–11.

Figure 7:
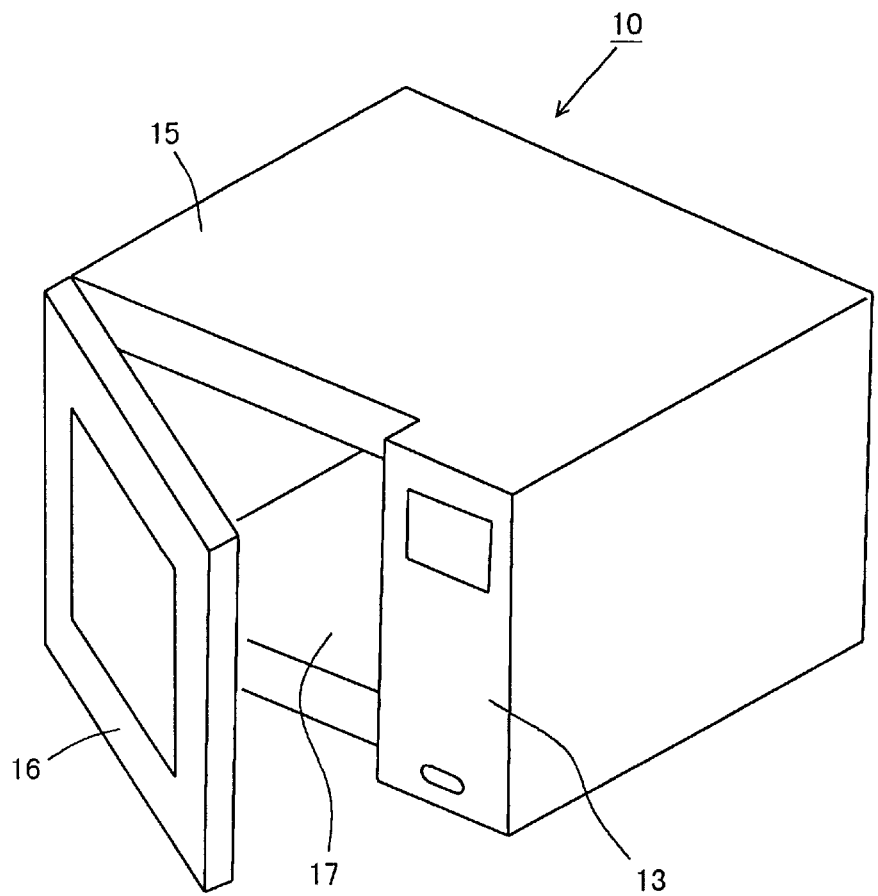
FIG. 7 is a perspective view of an appearance of a microwave oven according to a second embodiment of the present invention.
Figure 8:
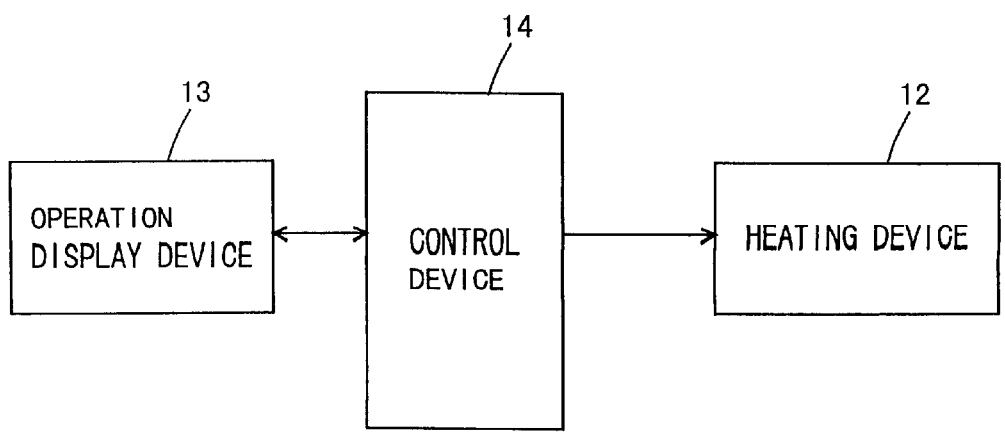
FIG. 8 is a block diagram showing a structure of the microwave oven of FIG. 7.
Figure 9:
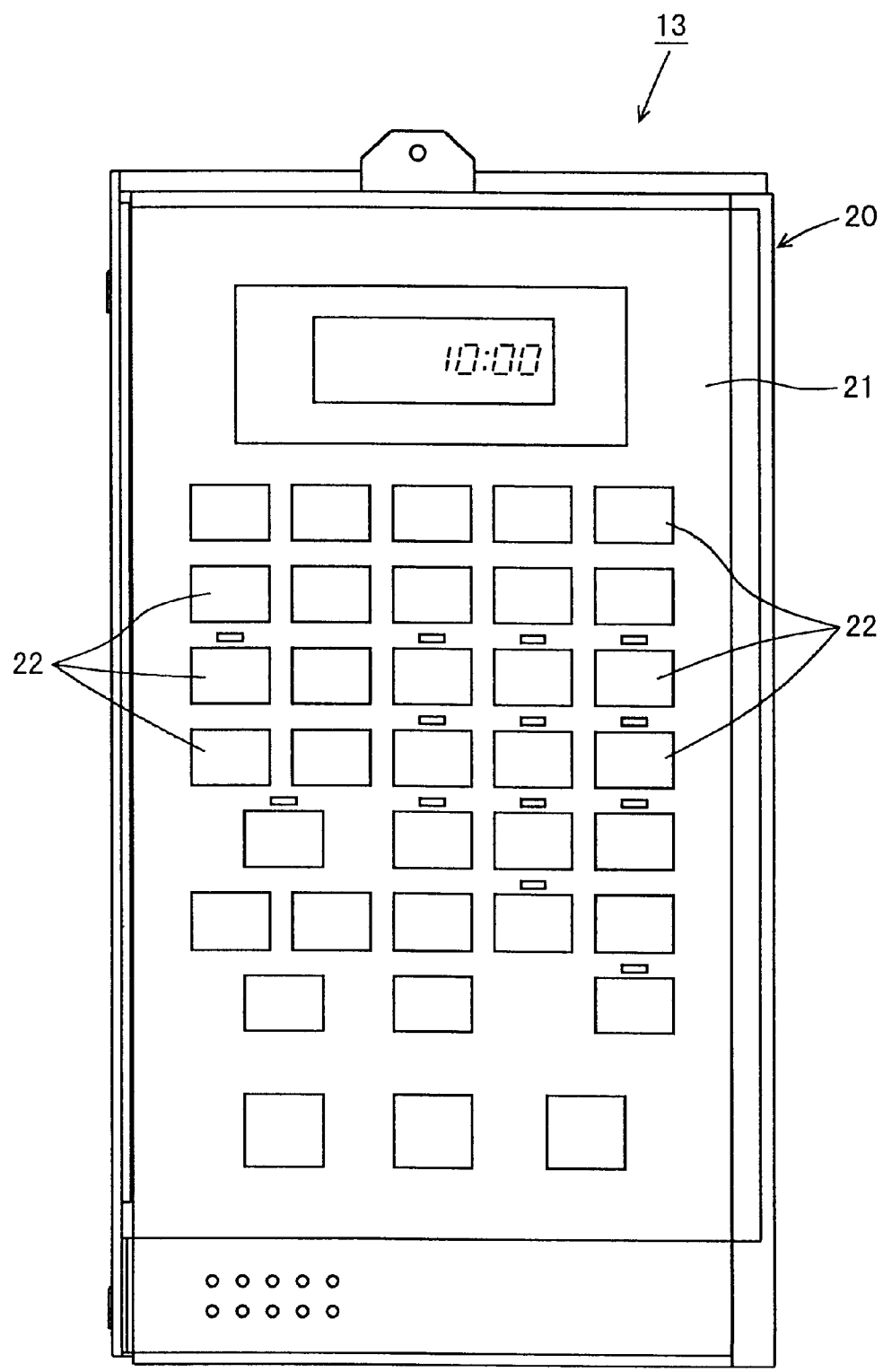
FIG. 9 is a front view of the operation display device of the microwave oven of FIG. 7.
Figure 10:
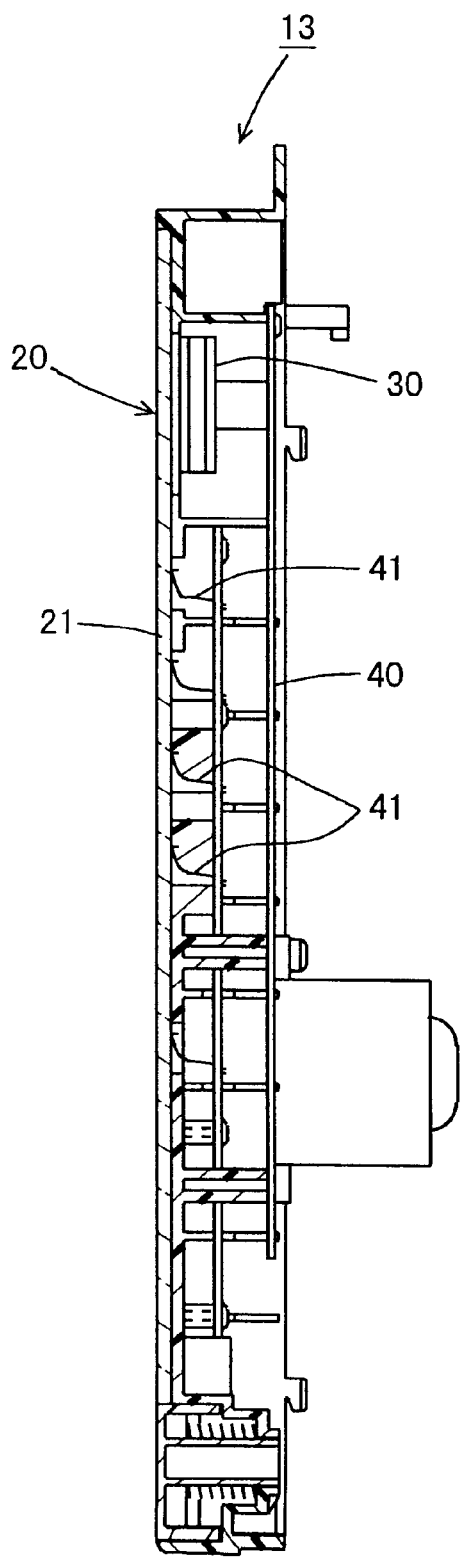
FIG. 10 is a vertical sectional view of the operation display device of FIG. 9.
Figure 11:
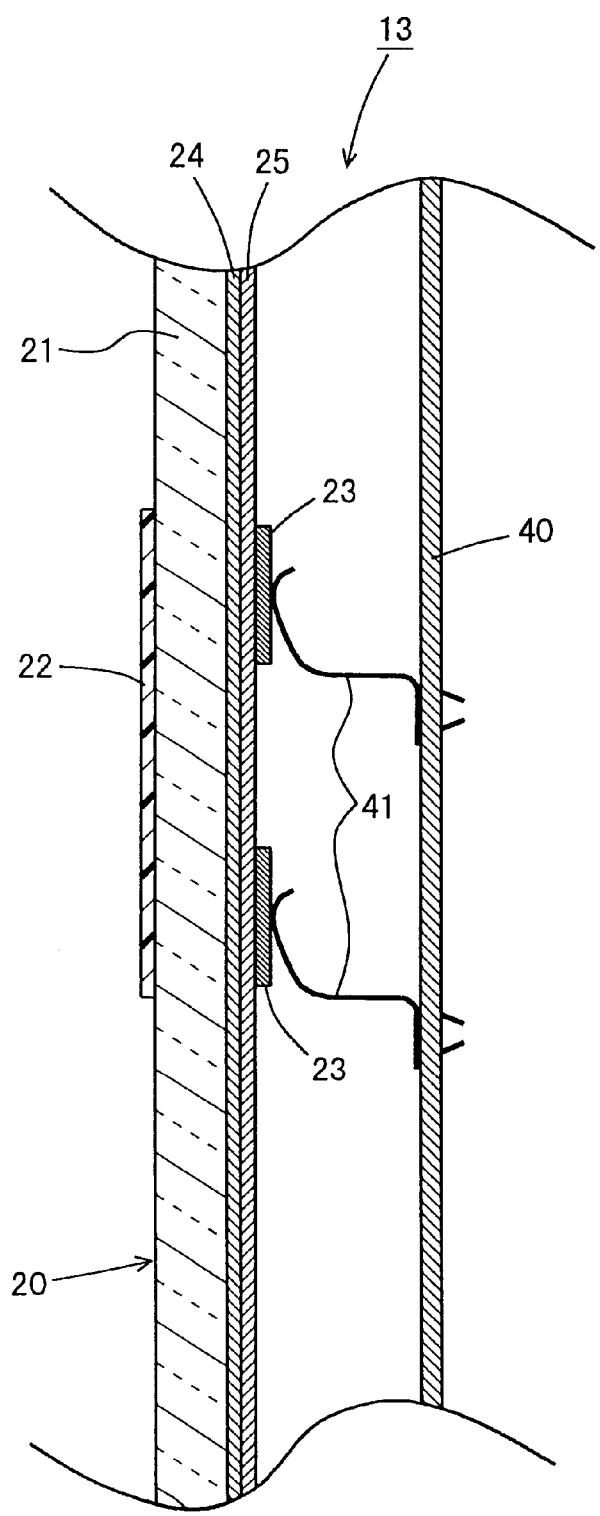
FIG. 11 is an enlargement of the main part of FIG. 10.

A microwave oven 10 according to the second embodiment of the present invention includes a heating device 12, an operation display device 13, and a control device 14, as shown in FIG. 8. The housing of microwave oven 10 is enclosed by an oven case 15. A heating chamber 17 is provided in oven case 15, as shown in FIG. 7.

Heating device 12 functions to heat and cook the material accommodated in the heating chamber by driving a heating source such as a heater, magnetron, or the like using commercially available power supplies.

Operation display device 13 is provided at one side of a door 16 at the front of oven case 15 to output a corresponding signal to control device 14 when a touch operation is effected by the user, in addition to display information of characters and symbols such as the current time, the recipe, the label of a plurality of automatic cooking courses, and the like. Operation display device 13 includes at least a touch panel 20, a display 30, and a circuit board 40. The structure thereof will be described afterwards.

Control device 14 is formed of a microcomputer to control the heating operation of heating device 12 in response to a command signal input from operation display device 13, and also control the display operation on display 30 of operation display device 13.

The structural element of operation display device 13 will be described here.

A touch panel 20 has a front electrode 22 that serves as a key printed in a matrix on the surface of a transparent glass substrate 21 having planar front and back planes, and a back electrode 23 printed at the back plane in a pattern identical to that of front electrode 22. Front electrode 22 is formed of, for example, platinum. Back electrode 23 is formed of, for example, silver carbon.

Display 30 has a segment type LED (light emitting diode) structure in which LEDs are embedded in the form of numerals and text to represent display on a rectangular substrate, and mounted at a predetermined region of circuit board 40 that will be described in the following.

Circuit substrate 4 is arranged spaced apart from the back side surface of touch panel 10 by a predetermined distance. A plurality of resilient metal terminals 31 are provided at circuit board 40. Each of the plurality of resilient metal terminals 31 is connected with pressure to each back electrode 23 of touch panel 20. Circuit board 40 is mounted with a circuit element that detects change in the dielectric constant occurring across front and back electrodes 22 and 23 sandwiching glass substrate 21 when front electrode 22 of touch panel 20 is pressed by the operator, and provides to control device 4 a command signal corresponding to the detected key. Control device 4 carries out a relevant process according to the command signal.

Microwave oven 10 of the present embodiment is characterized in that a half mirror film 24 is attached all over the back plane of transparent glass substrate 21 forming touch panel 20 to conceal the back side from the front side.

Half mirror film 24 is formed of an insulative material.

A black screen film 25 to conceal the back side circuit board 40 is provided all over half mirror film 24 except for the region corresponding to the outer shape of display 30. The above-dexcribed plurality of back electrodes 23 are formed on screen film 25. Screen film 25 is formed by silk printing or the like of a non-conductive material to ensure the electric isolation of each of back electrodes 23.

Although the back side appearance is completely hidden from the front side of touch panel 20, the light emitted display of information on display 30 mounted at the back side circuit board 40 can be seen through the front side of touch panel 20.

Operation display apparatus 13 of the above-described structure is configured to improve the sense of high quality by using a transparent glass substrate 21 as the base for touch panel 20. The inconvenience of using a transparent glass substrate 21 is alleviated by using a half mirror film 24 and a screen film 25. Circuit board 40 and display 30 arranged at the back side of touch panel 20 is concealed from the eyes of the user from the front side of touch panel 20 to improve the design. Although display 30 disposed at the back side of touch panel 20 is prevented from being seen through from the front surface by means of half mirror film 24, the light emitting display of information on display 30 can be viewed from the front side by virtue of the property of half mirror film 24. Therefore, the visuality of the displayed information can be ensured.

Since key input is allowed by just touching touch panel 20, the operability and sense of manipulation by the user can be improved than the case where the conventional depression type keys are employed.

By attaching a touch panel 20 based on a glass substrate 21 with a flat surface on the surface of microwave oven 10, the design of the outside appearance of microwave oven 10 can be improved.

The present embodiment has been described in which operation display device 13 is employed in a microwave oven. Operation display device 3 is applicable to various electronic equipment other than a microwave oven.

In the present embodiment, a structure is employed to improve the sense of high quality by using a transparent glass substrate as the base for the touch panel while the inconvenience of using a transparent glass substrate is alleviated by using a half mirror film. The circuit board and display disposed at the back side of the touch panel is concealed from the eyes of the user from the front side of the touch panel to improve the design. Although the display disposed at the back side of the touch panel is prevented from being seen through from the front surface by means of the half mirror film, the light emitting display of information on the display can be viewed from the front side by virtue of the property of the half mirror film. Therefore, the visuality of the displayed information can be ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high frequency heating apparatus that can heat and cook an object, and placed above an apparatus that can perform heating and cooking, comprising:

a case covering a housing of said high frequency heating apparatus, a fan outside said case to send air below said case to a predetermined direction, an operation unit to set an operation of said fan, and a control unit controlling the operation of said fan, wherein said control unit executes time limit control driving said fan for a predetermined time after drive of said fan has been initiated and terminating drive of said fan by one manipulation on said operation unit, and wherein said control unit extends the period of time of driving said fan in said time limit control whenever said manipulation of said operation unit has been effected before particular period of time has elapsed after an immediately preceding operation.

2. The high frequency heating apparatus according to claim 1, wherein said control unit extends by a constant period of time the time of driving said fan in said time limit control according to a number of times of manipulation on said operation unit.

3. The high frequency heating apparatus according to claim 1, further comprising:

a start designation unit manipulated to initiate drive of said fan, and an end designation unit manipulated to end drive of said fan, wherein said control unit drives said fan according to manipulation of said start designation unit and said end designation unit.

4. The high frequency heating apparatus according to claim 1, wherein said operation unit is formed of a touch panel, wherein said touch panel comprises a transparent substrate with a touch key, arranged at a site facing an operator, and a film arranged at a back side of a plane of said substrate facing the operator, having reflectance of visible light higher than the reflectance of said substrate.

5. The high frequency heating apparatus according to claim 4, wherein said film is a half mirror.

6. The high frequency heating apparatus according to claim 4, wherein said substrate further comprises a display unit at a back side of the plane facing the operator to display information, wherein said film comprises a first film arranged at a region corresponding to said display unit, and a second film arranged at a region other than said region corresponding to said display region, said first film being formed of a half mirror, and said second film being formed of a material blocking visible light.

7. The high frequency heating apparatus according to claim 4, wherein said substrate includes a first electrode arranged at a plane facing the operator, and a second electrode arranged at a back side of the plane facing the operator and corresponding to said first electrode, wherein said film is arranged between said substrate and said second electrode.

* * * * *